(12) United States Patent
Berg et al.

(10) Patent No.: US 7,609,069 B2
(45) Date of Patent: Oct. 27, 2009

(54) METHOD TO DETECT SHORTED SOLENOID COILS

(75) Inventors: Robert Berg, Canton, MI (US); Richard Graham, III, Southfield, MI (US); Christy J. Bose, Novi, MI (US); Scott E. Carpenter, Livonia, MI (US)

(73) Assignee: Kelsey-Hayes Company, Livonia, MI (US)

( * ) Notice: Subject to any disclaimer, the term of this patent is extended or adjusted under 35 U.S.C. 154(b) by 166 days.

(21) Appl. No.: 11/980,849

(22) Filed: Oct. 31, 2007

(65) Prior Publication Data

US 2009/0108849 A1    Apr. 30, 2009

(51) Int. Cl.
*G01R 31/06* (2006.01)
*G01R 29/20* (2006.01)

(52) U.S. Cl. ..................... 324/546; 324/726

(58) Field of Classification Search ............... 324/546, 324/537, 500, 726, 772, 547, 545
See application file for complete search history.

(56) References Cited

U.S. PATENT DOCUMENTS

| | | | |
|---|---|---|---|
| 2,788,486 A | 4/1957 | Guggi | |
| 3,267,370 A | 8/1966 | Praeg | |
| 4,838,037 A | 6/1989 | Wood | |
| 5,059,912 A | 10/1991 | Trampert | |
| 5,493,231 A * | 2/1996 | Nicollian et al. | 324/769 |
| 5,506,508 A | 4/1996 | Zimmermann | |
| 5,694,044 A | 12/1997 | Crowley et al. | |
| 6,265,891 B1 | 7/2001 | Yamada et al. | |
| 6,320,399 B1 | 11/2001 | Kunz et al. | |
| 6,785,470 B2 * | 8/2004 | Ichimasa | 396/206 |
| 7,071,740 B2 * | 7/2006 | Adams et al. | 327/110 |
| 7,273,038 B2 * | 9/2007 | Hayakawa | 123/478 |
| 7,321,222 B2 * | 1/2008 | Hojo | 323/224 |

FOREIGN PATENT DOCUMENTS

| | | |
|---|---|---|
| JP | 11218256 A | 8/1999 |
| KR | 10-1997-0040603 A | 7/1997 |
| KR | 10-2006-0031227 A | 4/2006 |

OTHER PUBLICATIONS

International Search Report from PCT/US2008/081907 dated May 27, 2009.

\* cited by examiner

*Primary Examiner*—Hoai-An D Nguyen
(74) *Attorney, Agent, or Firm*—MacMillan, Sobanski & Todd, LLC

(57) ABSTRACT

A method for testing the continuity of a coil that is subjected to a high frequency pulse modulated current that includes sensing a coil voltage, determining a ratio of the sensed coil voltage to the supply voltage and comparing the ratio to a threshold to determine whether the solenoid coil is functional.

11 Claims, 7 Drawing Sheets

METHOD TO DETECT SHORTED SOLENOID COILS

CROSS-REFERENCE TO RELATED APPLICATIONS

Not Applicable

BACKGROUND OF THE INVENTION

This invention relates in general to vehicle control systems and in particular to a method to detect shorted solenoid coils while the coils are excited by a high frequency Pulse Width Modulated voltage.

Motor vehicles are becoming increasingly sophisticated, especially with regard to electronic controllers for various onboard systems. The electrical to mechanical interfaces for many of these systems include a coil that is used to displace a mechanical device, such as a valve armature with the displacement of the armature being a function of the current flowing through the valve. Several examples include solenoid valves that control vehicle brakes in Anti-Lock Brake, Traction Control and Vehicle Stability Control Systems, solenoid valves that control torsion rods in Active Suspensions Systems and coils that control steering assist in Electro-Hydraulic Steering Systems.

Typical control systems utilize an electronic switch, such as a Field Effect Transistor (FET) to control the current flowing through the coil of a solenoid valve. The FET would have a drain terminal connected to one end of the solenoid coil and a source terminal connected to ground. The other end of the solenoid coil would be connected to a power supply, while the gate of the FET would be connected to a control port of an Electronic Control Unit (ECU). Typically, the ECU control port will be either "low" at ground potential or "high" at a fixed voltage, such as five volts. When the control port is low, the FET is in a non-conducting state and blocks current flow through the solenoid coil while, when the control port is high, the FET is in a conducting state, allowing a current to flow through the solenoid coil.

Should the solenoid coil become shorted, a large current would flow through the FET when it is in a conducting state, which may damage the FET. Accordingly, it is known to test the continuity of the solenoid coils for shorts upon initial startup of a vehicle. However, it would be desirable if the coils also could be tested while the vehicle and the control system are being operated. This would be especially useful for instances when the FET gate is excited by a pulse width modulated gate voltage having a variable duty cycle. In such a case, the times that the FET is on or off vary as the duty cycle changes. Accordingly, it would be desirable to have a testing method for coils that could be implemented while the system is being controlled with a variable duty cycle FET gate voltage.

BRIEF SUMMARY OF THE INVENTION

This invention relates to a method to detect shorted solenoid coils in a vehicle control system while the coils are excited by a high frequency Pulse Width Modulated voltage.

The present invention contemplates a method for testing the operation of a hydraulic solenoid valve of a vehicle control system where the valve solenoid is connected between a power supply and a drain terminal of a Field Effect Transistor (FET). The FET also has a source terminal connected to ground and a gate terminal and is responsive to a voltage applied to the gate terminal to switch between conducting and non-conducting states. The invention further contemplates that the valve is an analog valve operative in a Pulse Width Modulated (PWM) mode in which a PWM voltage is applied to the FET gate. During one of either the on portion or the off portion of the PWM voltage, the method senses the supply voltage and the FET drain voltage. The method then calculates the ratio of the FET drain voltage to the supply voltage and compares the resulting ratio to a threshold to determine whether the solenoid coil is operative.

Additionally, the method senses the supply voltage and the FET drain voltage after the PWM signal has been on for a first predetermined time period but before the start of a second predetermined time period preceding the PWM signal being switched off. The method generates a fault signal for a shorted solenoid coil upon determining that the ratio of the FET drain voltage to the supply voltage is greater than a first threshold and a fault signal for an open coil upon determining that the ratio of the FET drain voltage to the supply voltage is less than a second threshold.

The invention also contemplates that the vehicle control system includes a plurality of analog hydraulic solenoid valves with each valve controlled by a corresponding FET having a gate connected to PWM voltage source. For such a control system, at least one queue ranking is maintained for each of the solenoid coils in a conducting state with the queue for each coil being incrementally increased each time that the coil is considered for testing. The method then selects the coil with the most mature rank in the queue that is eligible for testing and subsequently tests the selected coil for a shorted condition.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
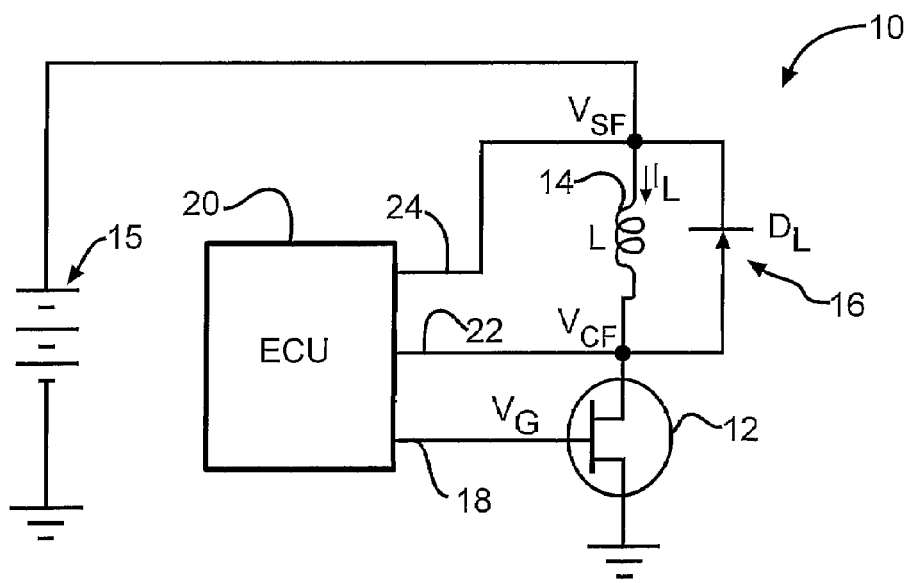
FIG. 1 is a schematic diagram of a typical control circuit for a single solenoid coil that utilizes the present invention.

Referring again to the drawings, there is shown in FIG. 1, a typical vehicle control system 10 that utilizes a Field Effect Transistor (FET) 12 to control the flow of electric current through a solenoid coil 14. The solenoid coil is included in a control device, such as a solenoid valve in an electronic brake control system or a vehicle stability control system. As shown in FIG. 1, the coil 14 is connected between a drain terminal of the FET 12 and a power supply 15. A fly-back diode 16 is connected across the coil 14 and functions to provide a path for dissipation of the coil current when the FET 12 is switched to a non-conducting state. A source terminal of the FET 12 is connected to ground while a gate terminal of the FET 12 is connected to a control terminal 18 on an Electronic Control Unit (ECU) 20. The ECU 20 is operative to change the operating states of the FET 12 between conducting and non-conducting.

The ECU 20 typically includes a microprocessor (not shown) with a memory that stores an operating algorithm. The ECU microprocessor also is typically connected to one or more sensors that monitor operating parameters of the vehicle. The microprocessor, in accordance with the operating algorithm, is responsive to the sensor signals to apply a gate voltage $V_G$ to the FET gate terminal to selectively switch the FET 12 between conducting and non-conducting states to activate and deactivate the coil 14. A coil feedback terminal 22 on the ECU 20 is connected to the FET drain terminal while a voltage supply feedback terminal 24 on the ECU 20 is connected to the end of the coil connected to the power supply 15. The ECU coil feedback terminal 22 monitors a coil feedback voltage $V_{CF}$, while the ECU voltage supply feedback terminal 24 monitors the power supply feedback voltage $V_{SF}$.

Figure 2:
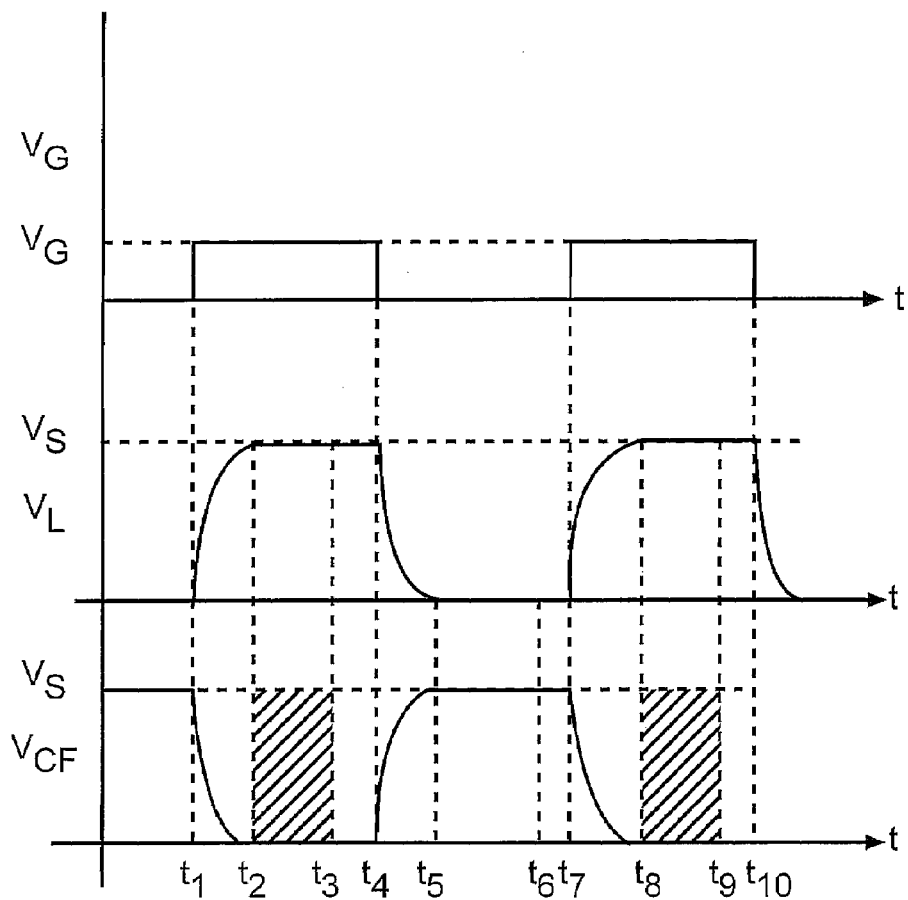
FIG. 2 illustrates voltage waveforms for the circuit shown in FIG. 1.

The operation of the circuit shown in FIG. 1 will now be explained in light of the voltage waveforms shown in FIG. 2. The upper curve in FIG. 2 illustrates the gate voltage $V_G$ applied to the gate of the FET 12 by the ECU 16. The gate voltage varies between zero and a control voltage, such as, for example, five volts with the gate voltage increasing at times $t_1$ and $t_7$ and returning to zero at times $t_4$ and $t_{10}$. When the gate voltage $V_G$ is zero, the FET 12 is in a non-conducting state and no current flows through the coil 14. Conversely, when the gate voltage is $V_G$, the FET 12 is in a conducting state and current flows through the coil 14.

When the FET is conducting, a current $I_L$ flows through the coil L. The current $I_L$ builds to a maximum value of $V_S/R_S$, where $R_S$ is the equivalent resistance of the coil L. At the same time, the voltage across the coil $V_L$, or $V_{SF}-V_{CF}$, increases from zero to $V_S$, as shown in the middle curve of FIG. 2. When the FET 12 switches to its non-conducting state, the coil current $I_L$ decays to zero as the current is dissipated through the fly-back diode 16 and the voltage across the coil L also decays back to zero. Regarding the coil feedback voltage $V_{CF}$, when the FET 12 is not conducting, no current flows through the coil 14 and the supply voltage $V_S$ appears at the FET drain terminal and thereby at the ECU coil feedback terminal 22, as shown in the bottom curve of FIG. 2. When the FET 22 is conducting, the FET drain terminal is switched to ground and an essentially zero voltage appears at the ECU coil feedback terminal 22. A voltage divider (not shown) may be inserted between the FET drain 27 and the ECU feedback port 28 to scale the voltage applied to the port to a satisfactory magnitude.

Proportional control of a valve or other solenoid operated device may be achieved by applying a high frequency Pulse Width Modulated (PWM) control voltage to the gate of the FET 12. Such high frequency PWM control voltages are typically within a frequency range of 2 kHz to 25 kHz; however, the invention also may be practiced for control voltage frequencies that are outside of this range. Because the coil L is switched on and off in direct proportion to the PWM gate voltage, the average current through the coil is a function of the duty cycle of the gate voltage. The resulting amount of valve armature movement is proportional to the average coil current and hence a direct function of the PWM gate voltage duty cycle. A high frequency PWM gate voltage may also be used in conjunction with a digital valve to reduce the average current and thereby the heating of the solenoid once the armature has moved.

The present invention is directed toward a method for failsafe testing of the coil 14 for a shorted condition while a high frequency PWM gate voltage is being applied to the gate or the FET 12. The method is illustrated by the flow chart shown in FIG. 3 and is described in the following with reference to the circuit shown in FIG. 1 and the voltage waveforms shown in FIG. 2. The flow chart is entered through block 30 and proceeds to decision block 32 where it is determined whether the gate terminal of the FET 12 is being subjected to a PWM voltage. Because the invention contemplates that method is implemented by the ECU microprocessor, it is a simple matter to determine the presence of a PWM voltage on the FET gate. If there is no PWM gate voltage being applied, the method exits through block 34. If, however, it is determined in decision block 32 that a PWM voltage is being applied to the gate of the FET 12, the method transfers to decision block 36.

In decision block 36, the method determines whether the PWM gate voltage is driving the FET 12 to be in an on, or conducting, state. If the PWM gate voltage is driving the FET 12 to an off, or non-conducting, state, the method transfers to block 34 and exits. If, in decision block 36 the method determines that the PWM gate voltage is driving the FET 12 to an on state, the method transfers forward to decision block 38.

In decision block 38, the method determines whether the PWM gate pulse has been present for a sufficiently long time for the circuit to settle into a steady state condition. This timing condition is best seen in FIG. 2 where during the periods of $t_1$ to $t_2$ and $t_7$ to $t_8$, the voltage at the coil feedback voltage $V_{CF}$ is undergoing a transient increase. Any reading during these time periods would not be indicative of the fully on coil condition. Likewise, it is necessary to provide sufficient time for reading and converting analog voltage values to digital values. Accordingly, the invention contemplates that any voltage measurement must be completed before the time $t_3$ for the first pulse shown in FIG. 2 and before the time $t_9$ for the second pulse shown in FIG. 2. Thus, measurements may be taken only during permitted time intervals of $t_2$ to $t_3$ and $t_8$ to $t_9$ for the voltages waveforms shown in FIG. 2. Therefore, in decision block 38, it is determined whether the circuit is within one of the permitted time periods for taking measurements. If the circuit is not within a permitted time period, the method transfers to block 34 and exits. If, however, the circuit is within a permitted time period, the method transfers forward to functional block 40. Additionally, the entire failsafe algorithm is performed with system interrupts disabled, so that external system events do not alter the timing assumptions made by this algorithm.

In functional block 40 the method senses, or reads, the values of the power supply feedback voltage $V_{SF}$ and the coil feedback voltage $V_{CF}$. The power supply feedback voltage $V_{SF}$ and the coil feedback voltage $V_{CF}$ are converted to digital values by a pair of analog to digital converters in the ECU 20 (not shown). The coil feedback voltage $V_{CF}$ is then compared to the power supply feedback voltage $V_{SF}$ by dividing the coil feedback voltage $V_{CF}$ by the power supply feedback voltage $V_{SF}$ to obtain a ratio of the voltages. The method then advances to decision block 42.

In decision block 42, it is determined whether or not the coil 14 is shorted by comparing the ratio of the coil feedback voltage $V_{CF}$ to the power supply feedback voltage $V_{SF}$ calculated in functional block 40 to a threshold. If the voltage ratio is greater than the threshold, it is an indication that the coil is shorted and the method transfers to functional block 44 where an error message is generated or a fault flag is set. This is because, for a fully operational coil L, the coil feedback voltage $V_{CF}$ should be pulled to ground when the FET 12 is conducting. Should the coil L be shorted, the source voltage $V_{SF}$ will appear at the drain terminal of the FET 12, raising the coil feedback voltage $V_{CF}$. The method then exits through block 34. The invention contemplates that 0.85 be utilized for the threshold in decision block 42; however, it will be appreciated that the invention also may be practiced with a voltage ratio threshold that is more or less than 0.85. If, on the other hand, the voltage ratio is less than or equal to the threshold, it is an indication that the coil is not shorted and the method exits through block 34. While a predetermined constant voltage ratio threshold has been described above, it will be appreciated that the invention also may be practiced with a voltage ratio threshold that is a function of one or more vehicle operating parameters.

Figure 3:
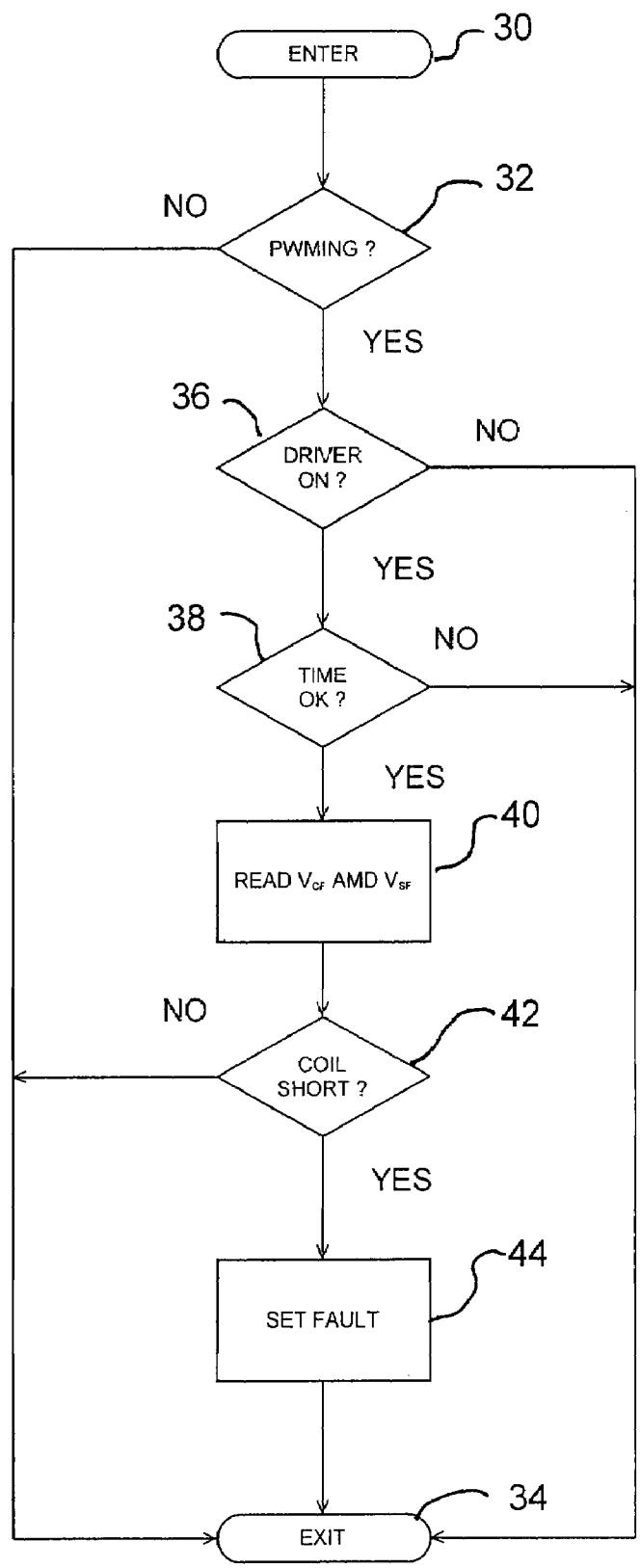
FIG. 3 is a flow chart for the present invention illustrating the present invention as applied to the circuit shown in FIG. 1.

Typically, electrical fault conditions are processed at the system loop rate. Since the method of the present invention will detect a fault only when the PWM is on, and not when the PWM rate is off, it is necessary to run the method at a rate that is faster than the system loop rate in order to insure that faults are captured. For example, for a system loop rate of 6 milliseconds, the invention contemplates running a fault detection algorithm that includes the above described failsafe test method once every millisecond. However, it will be appreciated that the fault detection algorithm also may be run at a faster or slower rate. It also will be appreciated that the flow chart shown in FIG. 3 is intended to be exemplary of the method and that the inventors contemplate that the invention also may be practiced other than has been illustrated in FIG. 3.

By establishing time periods at the beginning and the end of an on-cycle only during which the voltages $V_{SF}$ and $V_{CF}$ may be read, the method automatically compensates for a varying duty cycle of the control voltage PWM.

Figure 4:
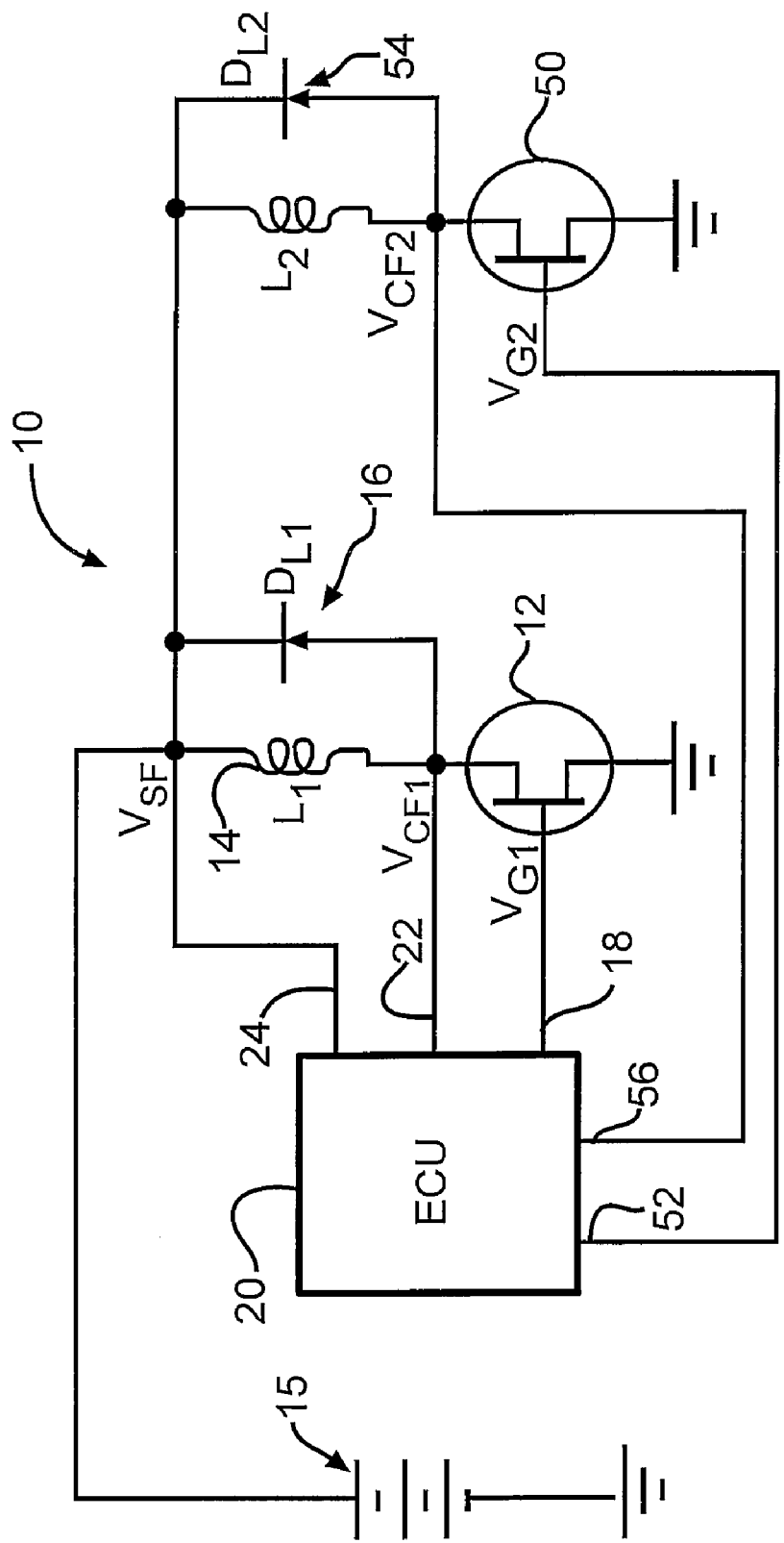
FIG. 4 is a schematic diagram of an alternate embodiment of the control circuit shown in FIG. 1 that includes a plurality of solenoid coils and that utilizes the present invention.

The present invention also contemplates an alternate embodiment that is applied to a circuit having a plurality of coils, as illustrated in FIG. 4. Components shown in FIG. 4 that are similar to components shown in FIG. 1 have the same numerical identifiers. While only two coils $L_1$ and $L_2$ are shown in FIG. 4, the alternate embodiment of the invention also may be applied to circuits containing more than two coils. The second coil is controlled by a second FET 50 having a gate connected to a second control terminal 52 on the ECU 20. A second flyback diode 54 is connected across the second coil $L_2$, while the drain terminal of the second FET 50 is connected to a second coil voltage feedback terminal 56 on the ECU 20. Thus, the first ECU coil feedback terminal 22 monitors a first coil feedback voltage $V_{CF1}$ while the second ECU coil feedback terminal 54 monitors a second coil feedback voltage $V_{CF2}$.

The alternate embodiment contemplates that timing information indicating the status of the PWM signal, i.e., whether its current state is on or off, how long this has been the state, and how long this will continue to be the state, for both of the FET's, 12 and 50, is stored in a Random Access Memory (RAM). The RAM is used by a timer peripheral to control the signal and by the microprocessor, or a main central processing unit (CPU), in the ECU 20 to quickly determine whether the failsafe test may be performed. Alternately, the data also can be read by the microprocessor, or the main CPU, in the ECU 20. In the failsafe routine of the alternate embodiment, a sorting algorithm is implemented that grants the highest priority to failsafe the solenoid which has gone the longest time since its failsafe was last performed. For this solenoid, a low-level function call is made to determine if the conditions are correct to perform the failsafe test.

Figure 5:
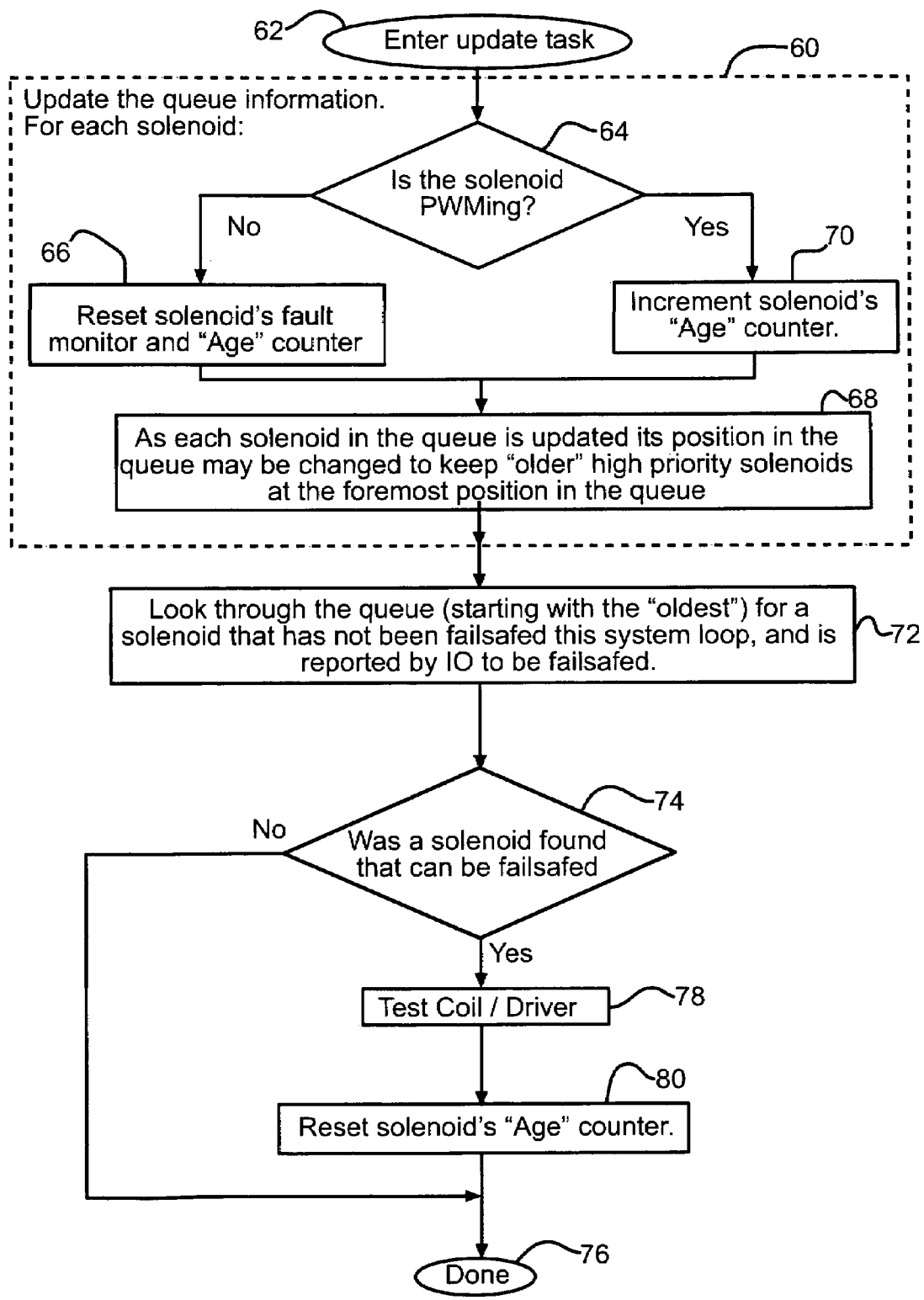
FIG. 5 is a flow chart illustrating the present invention as applied to the circuit shown in FIG. 4.

The alternate embodiment is illustrated by the flowchart shown in FIG. 5. The sorting routine for updating queue information is shown in the upper half of the flowchart that is contained within the box labeled 60. The sorting routine is entered through block 62 and proceeds to decision block 64 where each coil in the circuit is sequentially interrogated for the presence of PWM operation. If it is determined that the there is no PWM operation occurring, the routine transfers to functional block 66 where an age counter for the particular coil is reset to zero. The routine then continues to functional block 68. If, in decision block 64, it is determined that there is PWM operation occurring, the routine transfers to functional block 70 where an age counter for the particular coil is incrementally increased. The routine then continues to functional block 68. The preceding testing continues until each of the coils has been interrogated.

In functional block 72, the coil with the most senior standing in the testing queue is selected for actual testing. The routine then proceeds to decision block 74 where it is determined whether a coil was found in functional block 72 that qualified for testing. The qualification includes checking that the associated FET driver is on and that the timing for reading the voltages values is appropriate, as illustrated by decision blocks 36 and 38 in FIG. 3. If no coil was found, the routine exits through block 76. If a qualified coil was found in functional block 74, the routine transfers to functional block 78 where the failsafe testing method illustrated in blocks 40 through 44 in FIG. 3 is carried out. The routine then continues to function block 80 where the age counter for the tested coil is reset. Finally, the routine exits through block 76.

Figure 6:
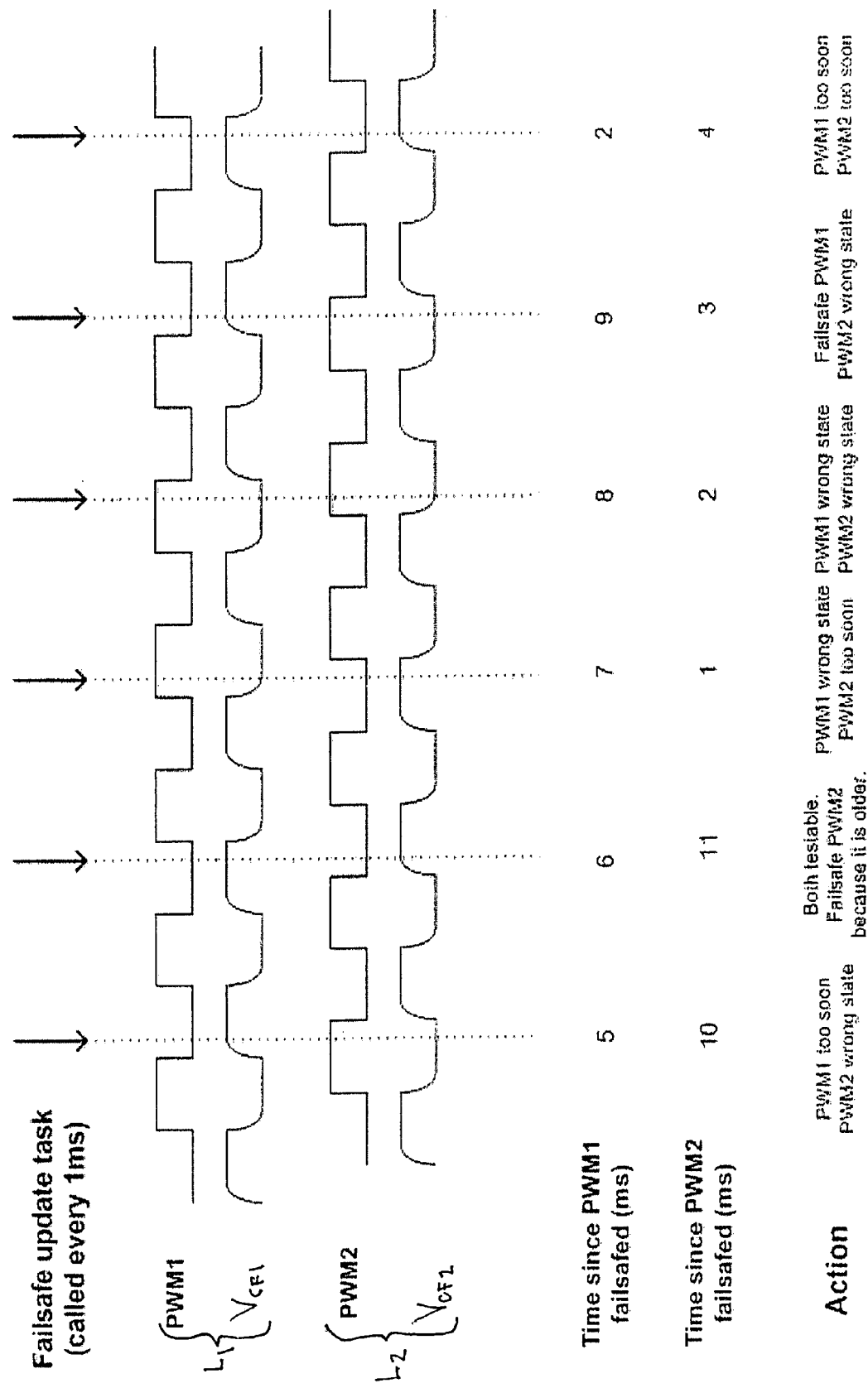
FIG. 6 illustrates selected voltage waveforms for the circuit shown in FIG. 4.

The operation of the routine shown in FIG. 5 is illustrated by the two pairs of waveforms shown in FIG. 6. The upper pair of waveforms corresponds to the first coil $L_1$, while the lower pair of waveforms corresponds to the second coil $L_2$. Thus, the top curve in the upper pair of waveforms that is labeled PWM 1 represents the gate voltage being applied to the first FET 14 that drives the first coil $L_1$ shown in FIG. 4. Similarly, the top curve in the lower pair of waveforms that is labeled PWM2 represents the gate voltage being applied to the second FET 50 that drives the second coil $L_2$. The lower curve in each pair of waveform represents the coil feedback voltage $V_{CF1}$ or $V_{CF2}$ that corresponds to the gate voltage shown immediately above. Sampling times are indicated by the vertical arrows at the top of the drawing sheet. The line labeled "Action" at the bottom of the drawing sheet illustrates the updating of the individual coil queue information from box 60 in FIG. 5. The two lines in FIG. 6 showing time since the corresponding coil was last failsafed represent the queue status of each coil. Note that at the second sampling time, both coils qualify for testing, but the coil feedback voltage $VC_{F2}$ representing the second coil $L_2$ is selected since it has the larger queue value. The queue value for the second coil $L_2$ is then reset, as shown at the next sampling time where the queue value for coil $L_2$ is now one while the queue value for the first coil $L_1$ has increased from six to seven. While only two coils are illustrated in FIG. 6, it will be appreciated that the invention also may be practiced for any number of coils.

Figure 7:
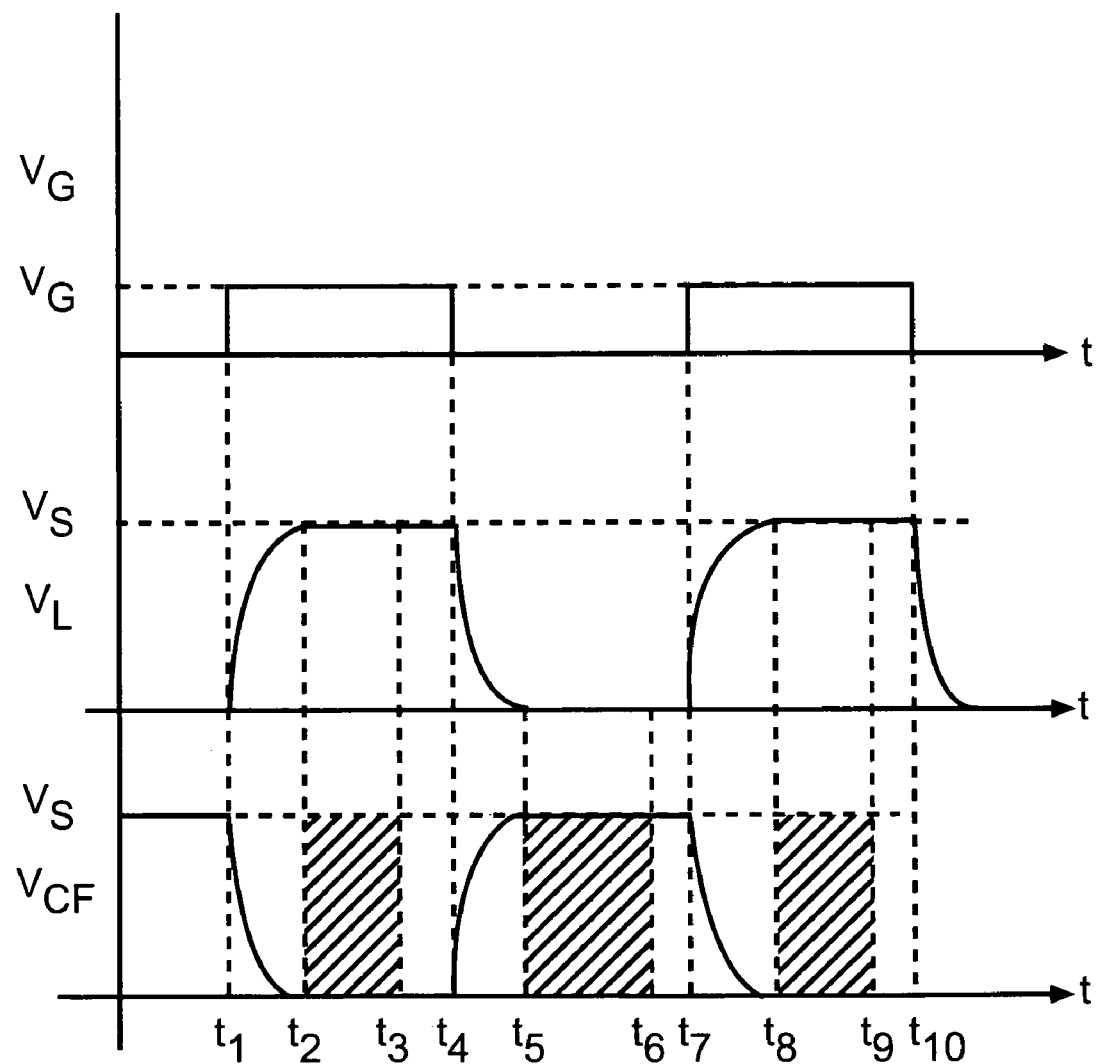
FIG. 7 illustrates voltage waveforms for an alternate embodiment of the invention that is applied to the circuit shown in FIG. 1.

Another alternate embodiment of the invention is illustrated in FIG. 7 in which the coil is tested for both a short condition, as described above, and for an open circuit or shorted driver FET condition. As shown in FIG. 7, the coil feedback voltage $V_{CF}$ should be approximately equal to the source voltage $V_{SF}$ when the associated FET is in a non-conducting state and the switching transients have ended. This would occur during the time period from $t_5$ through $t_6$ in FIG. 7. However, if the coil is open, or the driver FET for the coil is shorted, there will be no voltage appearing at the FET drain terminal and the coil feedback voltage will be approximately zero. Therefore, the alternate embodiment contemplates comparing the ratio of the coil feedback voltage $V_{CF}$ to the source feedback voltage $V_{SF}$ to a second voltage ratio threshold during the time period from $t_5$ through $t_6$. If the voltage ratio is less than the second voltage ratio threshold it is an indication that the coil is open, while if the voltage ratio is greater than or equal to the second voltage ratio threshold, it is an indication that the coil is operational. The invention contemplates utilizing 0.15 for the second voltage ratio threshold; however, the invention also may be practiced with a second voltage ratio threshold that is greater than or less than 0.15. It will also be appreciated that the second voltage ratio threshold may be a function of one or more vehicle operating parameters.

Figure 8:
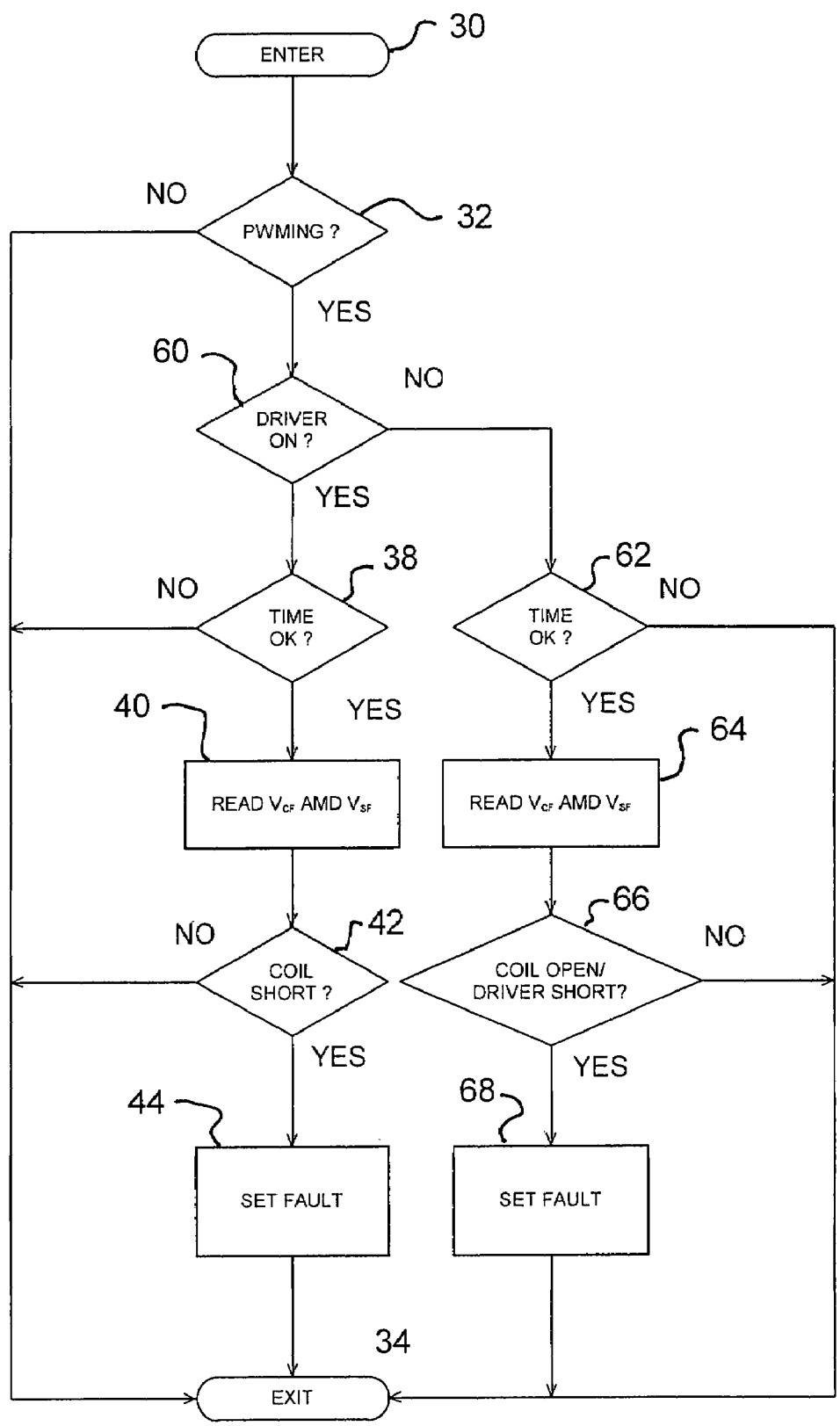
FIG. 8 is a flow chart illustrating the alternate embodiment of the invention shown in FIG. 7.

A flow chart for implementation of the alternate embodiment of the invention that is illustrated in FIG. 7 is shown in FIG. 8 where blocks that are similar to the blocks shown in FIG. 3 have the same numerical identifiers. In the flow chart of FIG. 8, the coil is tested for both short and open conditions. The flow chart is entered through block 30 and proceeds to decision block 32 where it is determined whether the gate terminal of the FET 12 is being subjected to a PWM voltage. If there is no PWM gate voltage being applied, the method exits through block 34. If, however, it is determined in decision block 32 that a PWM voltage is being applied to the gate of the FET 12, the method transfers to decision block 60.

In decision block 60, the method determines whether the PWM gate voltage is driving the FET 12 to be in its on, or conducting, state. If the method determines that the PWM gate voltage is driving the FET 12 to be in its on state, the method transfers to decision block 38 and proceeds as described above with reference to FIG. 3. If, in decision block 60 the PWM gate voltage is driving the FET 12 to be in its off, or non-conducting, state, the method transfers to decision block 62.

In decision block 62, the method determines whether the PWM gate pulse has been gone for a sufficiently long time for the circuit to settle into a steady state condition. As described above, this timing condition best seen in FIG. 7 where during the periods of $t_4$ to $t_5$, the voltage at the coil feedback voltage $V_{CF}$ is undergoing a transient increase. Any reading during these time periods would not be indicative of the fully off coil condition. Likewise, it is necessary to provide sufficient time for reading and converting analog voltage values to digital values. Accordingly, the invention contemplates that any voltage measurement must be completed before the time $t_7$ for the off time period shown in FIG. 7. Thus, the measurement may be taken only during permitted time intervals of $t_5$ to $t_6$ for the voltages waveforms shown in FIG. 7. Therefore, in decision block 62, it is determined whether the circuit is within a permitted time period for taking a measurement. If the circuit is not within a permitted time period, the method transfers to block 34 and exits. If, however, the circuit is within a permitted time period, the method transfers forward to functional block 64.

In functional block 64 the method reads the values of the power supply feedback voltage $V_{SF}$ and the coil feedback voltage $V_{CF}$. The power supply feedback voltage $V_{SF}$ and the coil feedback voltage $V_{CF}$ are converted to digital values by a pair of analog to digital converters in the ECU 20. The coil feedback voltage $V_{CF}$ is then compared to the power supply feedback voltage $V_{SF}$ by dividing the coil feedback voltage $V_{CF}$ by the power supply feedback voltage $V_{SF}$ to obtain a ratio of the voltages. The method then advances to decision block 66.

In decision block 66, as described above, the voltage ratio is compared to a second voltage ratio threshold. If the voltage ratio is less than the second voltage ratio threshold it is an indication that either the coil is open, or the driver FET for the coil is shorted, and the method transfers to functional block 68 where an error signal is generated or a fault flag is set. The method then exits through block 34. If, in decision block 66, the voltage ratio is greater than or equal to the second voltage ratio threshold it is an indication that the coil is operational and the method exits through block 34.

It will be appreciated that the method illustrated by the flow chart in FIG. 8 also may be applied to circuits that include a plurality of coils, as shown in FIG. 4. Likewise, when a plurality of coils are present, the method shown in FIG. 8 may be combined with the queuing method shown in FIG. 5 (not shown) to select the coil for testing that has the greatest queuing age. Finally, it also will be appreciated that the flow chart shown in FIG. 8 is intended to be exemplary of the method and that the inventors contemplate that the invention also may be practiced other than has been illustrated in FIG. 8.

In summary, the present invention allows for the shorted and/or open solenoid fault condition to be detected while a high frequency pulse-width modulation (PWM) is applied to the solenoid driver circuit. This is achieved with a design that does not interfere with control of the system, uses minimal processor resources, and achieves similar coverage as when the solenoid is directly controlled fully on.

The inventors believe that the present invention provides the following unique features:
- An ability to failsafe a condition that has only previously been detected during a static condition (i.e., while the solenoid command is fully on or fully off) is now being achieved while the solenoid is under pulse-width modulation control.
- A prioritization scheme that allows the highest priority be given to failsafe the solenoid having the longest elapsed time period since it was last tested.
- A concept of using shared data from an asynchronously running timer peripheral to quickly determine whether the failsafe can be performed.

The invention may be utilized in a wide variety of applications, such as, for example, an electronic brake control system and for control of the application of hydraulic pressure in other vehicle electronic brake systems, such as a Traction Control System and/or a Vehicle Stability Control System. Other applications may include control of multiple fuel injectors in an engine control system and control of solenoid valves in active suspension systems and electrically assisted power steering systems. The invention may also be practiced with non-vehicle applications where solenoid coils are utilized.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A method for testing the operation of a hydraulic solenoid valve having a valve solenoid of a vehicle control system, wherein the valve solenoid is connected between a power supply and a drain terminal of a Field Effect Transistor (FET), the FET also having a source terminal connected to ground and a gate terminal, the FET being responsive to a voltage applied to the gate terminal to switch between conducting and non-conducting states, wherein:

the valve is an analog valve operative in a Pulse Width Modulated (PWM) mode in which a PWM voltage is applied to the FET gate with the method including the following steps:
(a) sensing the supply voltage and the FET drain voltage during one of either the conducting or non-conducting state of the FET;
(b) calculating the ratio of the FET drain voltage to the supply voltage; and
(c) comparing the resulting ratio to a threshold to determine whether the solenoid coil is operative.

2. The method according to claim 1 wherein the method senses the supply voltage and the FET drain voltage after the PWM signal has been on for a first predetermined time period but before the start of a second predetermined time period preceding the PWM signal being switched off.

3. The method according to claim 2 wherein the method generates a fault signal for a shorted solenoid coil upon determining that the ratio of the FET drain voltage to the supply voltage is greater than the threshold.

4. The method according to claim 3 wherein the PWM voltage applied to the FET gate has a high frequency.

5. The method according to claim 1 wherein the method senses the supply voltage and the FET drain voltage after the PWM signal has been off for a first predetermined time period but before the start of a second predetermined time period preceding the PWM being switched on.

6. The method according to claim 5 wherein the method generates a fault signal for an open solenoid coil upon determining that the ratio of the FET drain voltage to the supply voltage is less than the threshold.

7. The method according to claim 3 wherein the PWM voltage applied to the FET gate has a high frequency.

8. The method according to claim 3 wherein the vehicle control system includes a plurality of analog hydraulic solenoid valves with each valve controlled by a corresponding FET having a gate connected to a corresponding PWM voltage source, the method further includes:
at least one queue ranking is maintained for each of the solenoid coils in a conducting state with the queue for each coil being incrementally increased each time that the coil is considered for testing, the method then selecting the coil with the most mature rank in the queue that is eligible for testing and subsequently testing the selected coil for a shorted condition.

9. The method according to claim 6 wherein the vehicle control system includes a plurality of analog hydraulic solenoid valves with each valve controlled by a corresponding FET having a gate connected to a corresponding PWM voltage source, the method further includes:
at least one queue ranking is maintained for each of the solenoid coils in a non-conducting state with the queue for each coil being incrementally increased each time that the coil is considered for testing, the method then selecting the coil with the most mature rank in the queue that is eligible for testing and subsequently testing the selected coil for an open condition.

10. The method according to claim 1 wherein the vehicle control system includes a plurality of analog hydraulic solenoid valves with each valve controlled by a corresponding FET having a gate connected to a corresponding PWM voltage source, the method further includes:
the method includes updating a first queue ranking for coils that are in a conducting condition and updating a second queue ranking for coils that are in a non-conducting condition and further wherein the method includes selecting a conducting coil with the most mature rank in the first queue that is eligible for testing and selecting a non-conducting coil with the most mature rank in the second queue that is eligible for testing.

11. The method according to claim 10 wherein the selected coil in each queue is tested.

* * * * *